(12) United States Patent
Ko et al.

(10) Patent No.: US 8,400,210 B2
(45) Date of Patent: *Mar. 19, 2013

(54) SEMICONDUCTOR APPARATUS

(75) Inventors: Jae Bum Ko, Ichon-shi (KR); Sang Jin Byeon, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 273 days.

This patent is subject to a terminal disclaimer.

(21) Appl. No.: 12/840,212

(22) Filed: Jul. 20, 2010

(65) Prior Publication Data

US 2011/0241763 A1    Oct. 6, 2011

(30) Foreign Application Priority Data

Mar. 31, 2010  (KR) .................. 10-2010-0029067

(51) Int. Cl.
*H03K 19/003*    (2006.01)
(52) U.S. Cl. .................... 327/526; 365/230.01
(58) Field of Classification Search ............. None
See application file for complete search history.

(56) References Cited

U.S. PATENT DOCUMENTS

| 7,102,905 B2 * | 9/2006 | Funaba et al. ............... 365/51 |
| 7,317,256 B2 | 1/2008 | Williams et al. |
| 7,598,523 B2 | 10/2009 | Luo et al. |
| 2005/0082664 A1* | 4/2005 | Funaba et al. ............... 257/724 |
| 2006/0044860 A1* | 3/2006 | Kinsley et al. ............... 365/52 |
| 2008/0315388 A1 | 12/2008 | Periaman et al. |
| 2009/0020865 A1 | 1/2009 | Su |
| 2009/0134500 A1 | 5/2009 | Kuo |
| 2009/0166873 A1 | 7/2009 | Yang et al. |

FOREIGN PATENT DOCUMENTS

| KR | 10-2002-0075608 A | 10/2002 |
| KR | 10-2008-0060674 | 7/2008 |
| KR | 10-2009-0056259 A | 6/2009 |

* cited by examiner

*Primary Examiner* — Hoai V Ho
*Assistant Examiner* — James G Norman
(74) *Attorney, Agent, or Firm* — William Park & Associates Ltd.

(57) ABSTRACT

A semiconductor apparatus includes an individual chip designating code setting block configured to generate a plurality of individual chip designating codes which have different code values or at least two of which have the same code value, in response to a plurality of chip fuse signals; and an individual chip activation block configured to compare the plurality of individual chip designating codes with chip selection address in response to the plurality of chip fuse signals, and enable one of a plurality of individual chip activation signals based on a result of the comparison.

19 Claims, 5 Drawing Sheets

SEMICONDUCTOR APPARATUS

CROSS-REFERENCES TO RELATED APPLICATION

The present application claims priority under 35 U.S.C. §119(a) to Korean Application No. 10-2010-0029067, filed on Mar. 31, 2010, in the Korean Intellectual Property Office, which is incorporated herein by reference in its entirety as if set forth in full.

BACKGROUND

1. Technical Field

The present invention relates to a semiconductor integrated circuit, and more particularly, to a semiconductor apparatus with a plurality of individual stacked chips.

2. Related Art

A semiconductor apparatus is designed to operate at a high speed with a data storage region of a large capacity.

To this end, a technique to stack individual chips in a wafer level and packaging them to manufacture individual products is developed.

Generally, the respective stacked individual chips are assigned addresses and data are stored in the chips using the assigned addresses.

When addresses are assigned to the respective stacked individual chips, the assigned addresses are designated by sequentially increasing or decreasing the values of codes consisting of a plurality of bits.

Such technologies to assign sequentially increasing or decreasing code values to stacked individual chips as addresses are used based on the assumption that any stacked individual chips have not failed.

However, if one of the stacked individual chips has failed, all the stacked individual chips cannot be used. For example, in a semiconductor apparatus having eight layers, failure of only one individual chip would render the remaining seven non-failed chips unusable, which reduces efficiency and productivity.

SUMMARY

Accordingly, various exemplary embodiments of the invention may provide a semiconductor apparatus in which a plurality of individual chips are stacked and non-failed chips can be used even when one of the stacked individual chips fails.

In one embodiment of the present invention, a semiconductor apparatus includes: an individual chip designating code setting block configured to generate a plurality of individual chip designating codes which have different code values or at least two of which have the same code value, in response to a plurality of chip fuse signals; and an individual chip activation block configured to compare the plurality of individual chip designating codes with a chip selection address in response to the plurality of chip fuse signals, and enable one of a plurality of individual chip activation signals based on a result of the comparison.

In another embodiment of the present invention, a semiconductor apparatus generating a first individual chip designating code, a second individual chip designating code and a third individual chip designating code, includes: an individual chip designating code setting block configured to generate the third individual chip designating code having a code value next to a code value of the first individual chip designating code when the second individual chip designating code is generated to have the same code value as the first individual chip designating code, wherein the first to third individual chip designating codes are compared with a chip selection address to enable one of a first individual chip activation signal, a second individual chip activation signal and a third individual chip activation signal.

BRIEF DESCRIPTION OF THE DRAWINGS

Features, aspects, and embodiments are described in conjunction with the attached drawings, in which.

DETAILED DESCRIPTION

Figure 1:
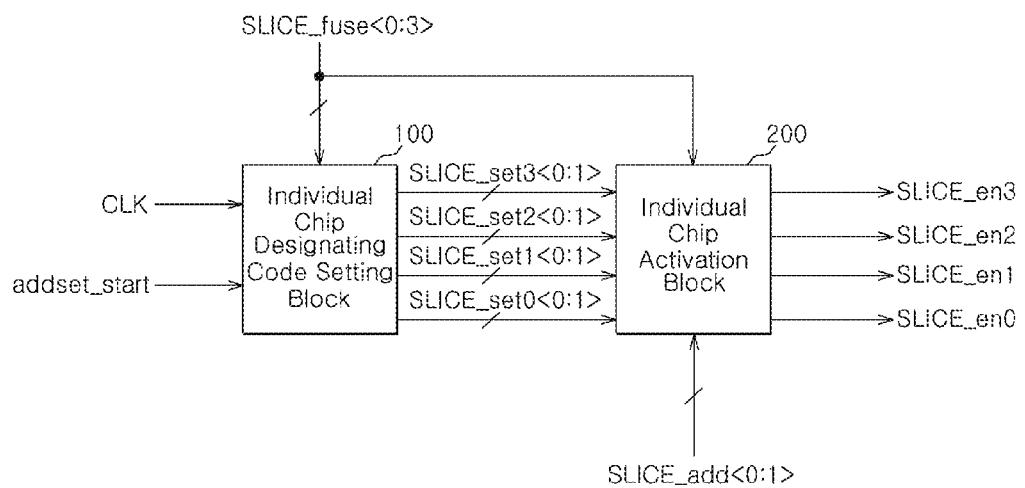
FIG. 1 is a diagram illustrating a configuration of a semiconductor apparatus in accordance with an embodiment of the present invention.

Reference will now be made in detail to the exemplary embodiments consistent with the present disclosure, examples of which are illustrated in the accompanying drawings. Whenever possible, the same reference numerals will be used throughout the drawings to refer to the same or like parts.

Referring to FIG. 1, a semiconductor apparatus in accordance with an embodiment of the present invention may include an individual chip designating code setting block 100, and an individual chip activation block 200.

The individual chip designating code setting block 100 is configured to generate first to fourth individual chip designating codes SLICE_set0<0:1>, SLICE_set1<0:1>, SLICE_set2<0:1> and SLICE_set3<0:1>, which have different code values or at least two of which have the same code value, in response to first to fourth chip fuse signals SLICE_fuse<0:3>. The individual chip designating code setting block 100 receives a clock CLK and an address setting start pulse addset_start and performs operations for setting the first to fourth individual chip designating codes SLICE_set0<0:1>, SLICE_set1<0:1>, SLICE_set2<0:1> and SLICE_set3<0:1>. For example, the individual chip designating code setting block 100 generates the first to fourth individual chip designating codes SLICE_set0<0:1>, SLICE_set1<0:1>, SLICE_set2<0:1> and SLICE_set3<0:1> having different code values when the first to fourth chip fuse signals SLICE_fuse<0:3> are enabled. The individual chip designating code setting block 100 is configured to determine the number of individual chip designating codes having the same code value in response to the first to fourth chip fuse signals SLICE_fuse<0:3>. The first to fourth chip fuse signals SLICE_fuse<0:3> are signals having information regarding failure of individual chips. The first to fourth chip fuse signals SLICE_fuse<0:3> may be generated using typical fuse circuits after testing the individual chips or may be inputted from outside of the semiconductor apparatus.

The individual chip designating code setting block 100 is configured to generate the first to fourth individual chip designating codes SLICE_set0<0:1>, SLICE_set1<0:1>, SLICE_set2<0:1> and SLICE_set3<0:1> whose code values sequentially increase or decrease when all the first to fourth chip fuse signals SLICE_fuse<0:3> are enabled. For example, the first individual chip designating code SLICE_set0<0:1> has the code value of '00', the second individual chip designating code SLICE_set1<0:1> has the code value of '01', the third individual chip designating code SLICE_set2<0:1> has the code value of '10', and the fourth individual chip designating code SLICE_set3<0:1> has the code value of '11'.

The individual chip designating code setting block 100 initializes the first individual chip designating code SLICE_set0<0:1> to '00' when the first chip fuse signal SLICE_fuse<0> is disabled, and generates the second individual chip designating code SLICE_set1<0:1> having the same code value as the first individual chip designating code SLICE_set0<0:1> when the second chip fuse signal SLICE_fuse<1> is disabled. The individual chip designating code setting block 100 generates the third individual chip designating code SLICE_set2<0:1> having the same code value as the second individual chip designating code SLICE_set1<0:1> when the third chip fuse signal SLICE_fuse<2> is disabled, and generates the fourth individual chip designating code SLICE_set3<0:1> having the same code value as the third individual chip designating code SLICE_set2<0:1> when the fourth chip fuse signal SLICE_fuse<3> is disabled.

The individual chip activation block 200 is configured to compare the first to fourth individual chip designating codes SLICE_set0<0:1>, SLICE_set1<0:1>, SLICE_set2<0:1> and SLICE_set3<0:1> with a chip selection address SLICE_add<0:1> in response to the first to fourth chip fuse signals SLICE_fuse<0:3>, and enable one of first to fourth individual chip activation signals SLICE_en0-SLICE_en3 depending upon a comparison result.

Figure 2:
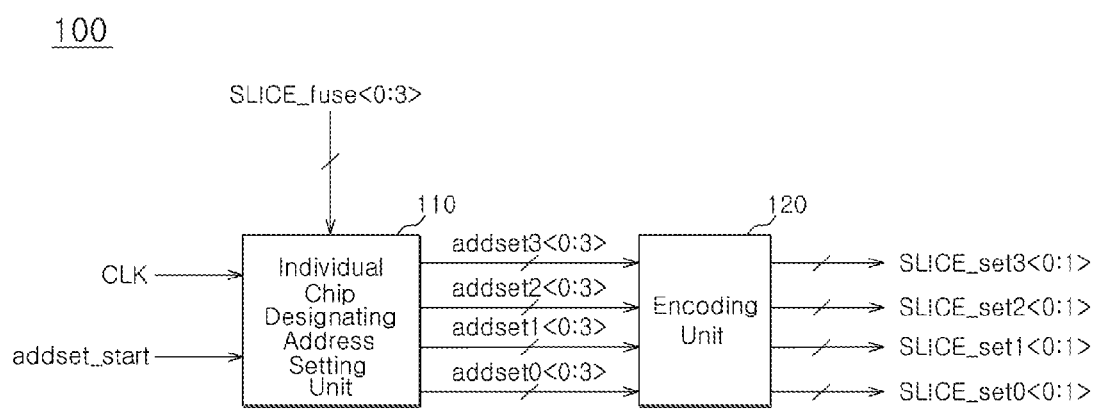
FIG. 2 is a diagram illustrating a configuration of the individual chip designating code setting block shown in FIG. 1.

Referring to FIG. 2, the individual chip designating code setting block 100 may include an individual chip designating address setting unit 110 and an encoding unit 120.

The individual chip designating address setting unit 110 is configured to generate first to fourth designating addresses addset0<0:3>, addset1<0:3>, addset2<0:3> and addset3<0:3> in response to the first to fourth chip fuse signals SLICE_fuse<0:3>. For example, the individual chip designating address setting unit 110 generates the first to fourth designating addresses addset0<0:3>, addset1<0:3>, addset2<0:3> and addset3<0:3> having different values from each other, when all the first to fourth chip fuse signals SLICE_fuse<0:3> are enabled. The individual chip designating address setting unit 110 initializes the first designating address addset0<0:3> to '0000' when the first chip fuse signal SLICE_fuse<0> is disabled, and generates the second designating address addset1<0:3> having the same value as the first designating address addset0<0:3> when the second chip fuse signal SLICE_fuse<1> is disabled. The individual chip designating address setting unit 110 generates the third designating address addset2<0:3> having the same value as the second designating address addset1<0:3> when the third chip fuse signal SLICE_fuse<2> is disabled, and generates the fourth designating address addset3<0:3> having the same value as the third designating address addset2<0:3> when the fourth chip fuse signal SLICE_fuse<3> is disabled.

The encoding unit 120 is configured to generate the first to fourth individual chip designating codes SLICE_set0<0:1>, SLICE_set1<0:1>, SLICE_set2<0:1> and SLICE_set3<0:1> by encoding the first to fourth designating addresses addset0<0:3>, addset1<0:3>, addset2<0:3> and addset3<0:3>.

Figure 3:
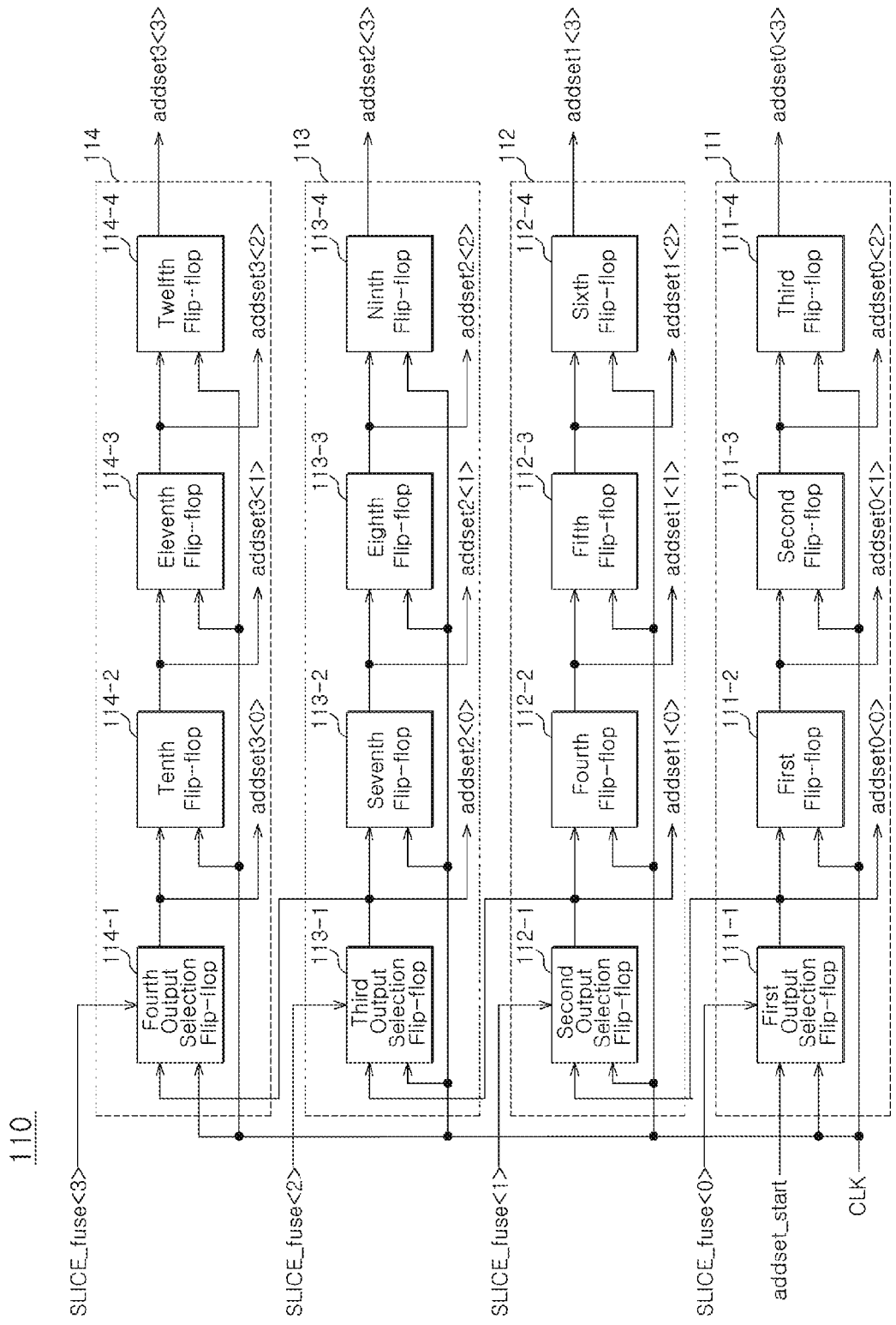
FIG. 3 is a diagram illustrating a configuration of the individual chip designating address setting unit shown in FIG. 2.

Referring to FIG. 3, the individual chip designating address setting unit 110 may include first to fourth designating address set generation sections 111-114.

The first designating address set generation section 111 is configured to generate the first designating address addset0<0:3> in response to the first chip fuse signal SLICE_fuse<0>.

The first designating address set generation section 111 may include a first output selection flip-flop 111-1 and first to third flip-flops 111-2, 111-3 and 111-4.

The first output selection flip-flop 111-1 outputs the address setting start pulse addset_start as the first bit addset0<0> of the first designating address addset0<0:3> when the address setting start pulse addset_start is inputted and the first chip fuse signal SLICE_fuse<0> is disabled. When the first chip fuse signal SLICE_fuse<0> is enabled, the first output selection flip-flop 111-1 outputs the address setting start pulse addset_start as the first bit addset0<0> of the first designating address addset0<0:3> after one cycle of the clock CLK.

The first flip-flop 111-2 outputs the output of the first output selection flip-flop 111-1 as the second bit addset0<1> of the first designating address addset0<0:3> after one cycle of the clock CLK.

The second flip-flop 111-3 outputs the output of the first flip-flop 111-2 as the third bit addset0<2> of the first designating address addset0<0:3> after one cycle of the clock CLK.

The third flip-flop 111-4 outputs the output of the second flip-flop 111-3 as the fourth bit addset0<3> of the first designating address addset0<0:3> after one cycle of the clock CLK.

When the address setting start pulse addset_start is inputted and the first chip fuse signal SLICE_fuse<0> is enabled, the first designating address set generation section 111 configured as described above generates the first designating address addset0<0:3> having the code value of '0001' after four cycles of the clock CLK. The first designating address set generation section 111 generates the first designating address addset0<0:3> having the code value of '0000' after four cycles of the clock CLK when the first chip fuse signal SLICE_fuse<0> is disabled. When the first designating address addset0<0:3> has the code value of '0000', the first designating address addset0<0:3> is regarded as initialized.

The second designating address set generation section 112 is configured to generate the second designating address addset1<0:3> in response to the second chip fuse signal SLICE_fuse<1>.

The second designating address set generation section 112 may include a second output selection flip-flop 112-1 and fourth to sixth flip-flops 112-2, 112-3 and 112-4.

The second output selection flip-flop 112-1 outputs the output of the first output selection flip-flop 111-1 as the first bit addset1<0> of the second designating address addset1<0:3> without delay when the second chip fuse signal SLICE_fuse<1> is disabled. When the second chip fuse signal SLICE_fuse<1> is enabled, the second output selection flip-flop 112-1 outputs the output of the first output selection flip-flop 111-1 as the first bit addset1<0> of the second designating address addset1<0:3> after one cycle of the clock CLK.

The fourth flip-flop 112-2 outputs the output of the second output selection flip-flop 112-1 as the second bit addset1<1> of the second designating address addset1<0:3> after one cycle of the clock CLK.

The fifth flip-flop 112-3 outputs the output of the fourth flip-flop 112-2 as the third bit addset1<2> of the second designating address addset1<0:3> after one cycle of the clock CLK.

The sixth flip-flop 112-4 outputs the output of the fifth flip-flop 112-3 as the fourth bit addset1<3> of the second designating address addset1<0:3> after one cycle of the clock CLK.

The second designating address set generation section 112 configured as described above generates the second designating address addset1<0:3> having the code value of '0010' after four cycles of the clock CLK when the second chip fuse signal SLICE_fuse<1> is enabled. When the second chip fuse signal SLICE_fuse<1> is disabled, the second designating address set generation section 112 generates the second designating address addset1<0:3> having the same code value as the first designating address addset0<0:3> after four cycles of the clock CLK.

The third designating address set generation section 113 is configured to generate the third designating address addset2<0:3> in response to the third chip fuse signal SLICE_fuse<2>.

The third designating address set generation section 113 may include a third output selection flip-flop 113-1 and seventh to ninth flip-flops 113-2, 113-3 and 113-4.

The third output selection flip-flop 113-1 outputs the output of the second output selection flip-flop 112-1 as the first bit addset2<0> of the third designating address addset2<0:3> without delay when the third chip fuse signal SLICE_fuse<2> is disabled. When the third chip fuse signal SLICE_fuse<2> is enabled, the third output selection flip-flop 113-1 outputs the output of the second output selection flip-flop 112-1 as the first bit addset2<0> of the third designating address addset2<0:3> after one cycle of the clock CLK.

The seventh flip-flop 113-2 outputs the output of the third output selection flip-flop 113-1 as the second bit addset2<1> of the third designating address addset2<0:3> after one cycle of the clock CLK.

The eighth flip-flop 113-3 outputs the output of the seventh flip-flop 113-2 as the third bit addset2<2> of the third designating address addset3<0:3> after one cycle of the clock CLK.

The ninth flip-flop 113-4 outputs the output of the eighth flip-flop 113-3 as the fourth bit addset2<3> of the third designating address addset2<0:3> after one cycle of the clock CLK.

When the third chip fuse signal SLICE_fuse<2> is enabled, the third designating address set generation section 113 configured as described above generates the third designating address addset2<0:3> having the code value of '0100' after four cycles of the clock CLK. When the third chip fuse signal SLICE_fuse<2> is disabled, the third designating address set generation section 113 generates the third designating address addset2<0:3> having the same code value as the second designating address addset1<0:3> after four cycles of the clock CLK.

The fourth designating address set generation section 114 is configured to generate the fourth designating address addset3<0:3> in response to the fourth chip fuse signal SLICE_fuse<3>.

The fourth designating address set generation section 114 may include a fourth output selection flip-flop 114-1 and tenth to twelfth flip-flops 114-2, 114-3 and 114-4.

The fourth output selection flip-flop 114-1 outputs the output of the third output selection flip-flop 113-1 as the first bit addset3<0> of the fourth designating address addset3<0:3> without delay when the fourth chip fuse signal SLICE_fuse<3> is disabled. When the fourth chip fuse signal SLICE_fuse<3> is enabled, the fourth output selection flip-flop 114-1 outputs the output of the third output selection flip-flop 113-1 as the first bit addset3<0> of the fourth designating address addset3<0:3> after one cycle of the clock CLK.

The tenth flip-flop 114-2 outputs the output of the fourth output selection flip-flop 114-1 as the second bit addset3<1> of the fourth designating address addset3<0:3> after one cycle of the clock CLK.

The eleventh flip-flop 114-3 outputs the output of the tenth flip-flop 114-2 as the third bit addset3<2> of the fourth designating address addset3<0:3> after one cycle of the clock CLK.

The twelfth flip-flop 114-4 outputs the output of the eleventh flip-flop 114-3 as the fourth bit addset3<3> of the fourth designating address addset3<0:3> after one cycle of the clock CLK.

When the fourth chip fuse signal SLICE_fuse<3> is enabled, the fourth designating address set generation section 114 configured as described above generates the fourth designating address addset3<0:3> having the code value of '1000' after four cycles of the clock CLK. When the fourth chip fuse signal SLICE_fuse<3> is disabled, the fourth designating address set generation section 114 generates the fourth designating address addset3<0:3> having the same code value as the third designating address addset2<0:3> after four cycles of the clock CLK.

Since the internal configurations of the first to fourth output selection flip-flops 111-1, 112-1, 113-1 and 114-1 are the same, only the configuration of the first output selection flip-flop 111-1 will be described below.

Figure 4:
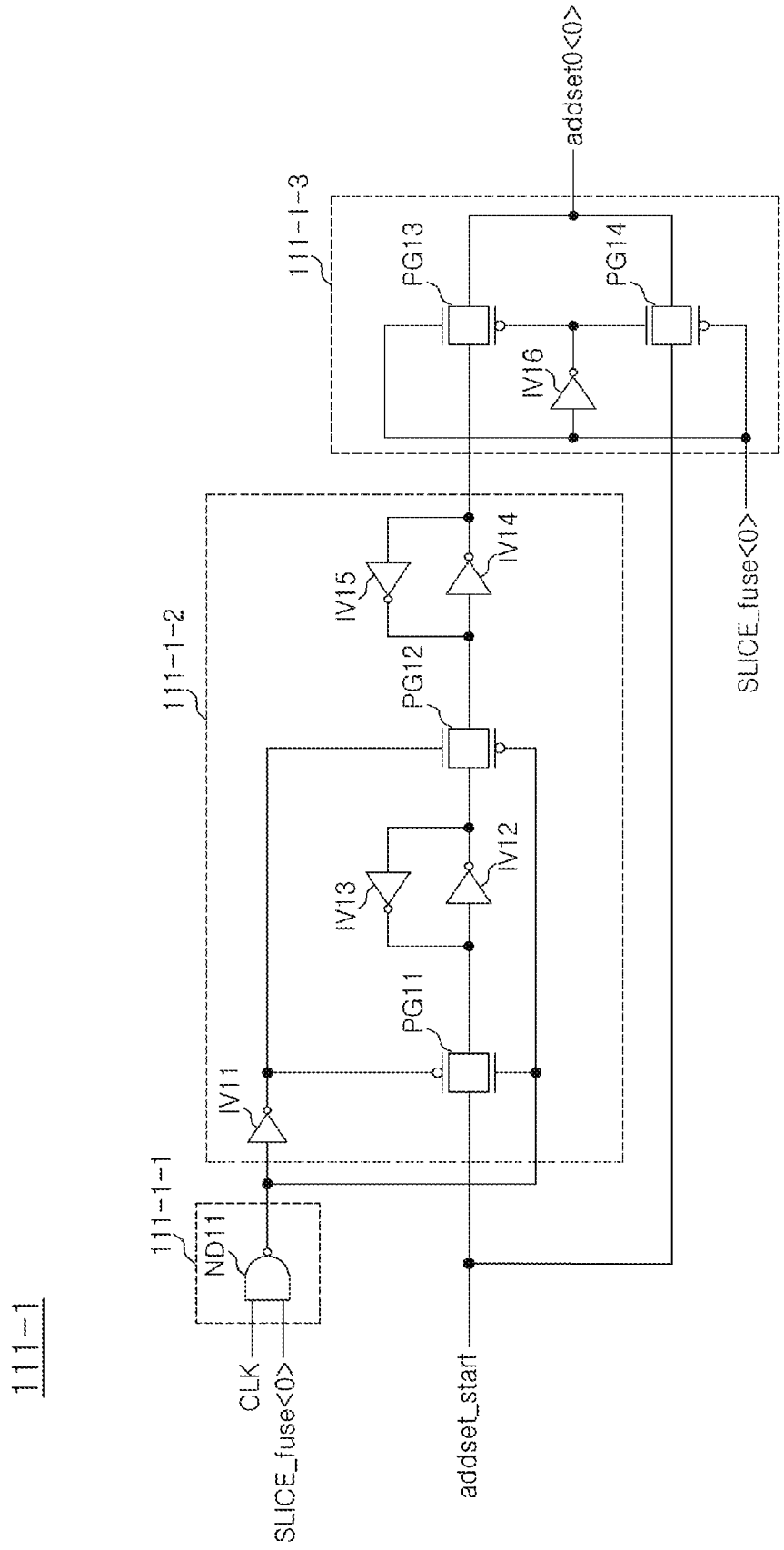
FIG. 4 is a diagram illustrating a configuration of the first output selection flip-flop shown in FIG. 3.

Referring to FIG. 4, the first output selection flip-flop 111-1 may include a clock control part 111-1-1, a flip-flop part 111-1-2, and a multiplexer 111-1-3.

The clock control part 111-1-1 is configured to invert and output the clock CLK when the first chip fuse signal SLICE_fuse<0> is enabled to a high level, or output a signal which is held to a high level regardless of the clock CLK when the first chip fuse signal SLICE_fuse<0> is disabled to a low level.

The clock control part 111-1-1 may include a NAND gate ND11. The NAND gate ND11 receives the clock CLK and the first chip fuse signal SLICE_fuse<0>, and the output of the NAND gate ND11 is provided to the flip-flop part 111-1-2.

The flip-flop part 111-1-2 is configured to receive and store the address setting start pulse addset_start when the output of the clock control part 111-1-1 is a high level, and output the stored signal when the output of the clock control part 111-1-1 is a low level.

The flip-flop part 111-1-2 may include first to fifth inverters IV11-IV15, and first and second pass gates PG11 and PG12. The first inverter IV11 receives the output signal of the NAND gate ND11. The first pass gate PG11 receives the output signal of the first inverter IV11 through the first control terminal, the output signal of the NAND gate ND11 through the second control terminal, and the address setting start pulse addset_start through the input terminal. The second inverter IV12 receives the output signal of the first pass gate PG11. The third inverter IV13 receives the output signal of the second inverter IV12 through the input terminal and provides its output as an input to the second inverter IV12. The second pass gate PG12 receives the output signal of the first inverter IV11 through the first control terminal, the output signal of the NAND gate ND11 through the second control terminal, and the output signal of the second inverter IV12 through the input terminal. The fourth inverter IV14 receives the output signal of the second pass gate PG12. The fifth inverter IV15 receives the output signal of the fourth inverter IV14 and provides its output as an input to the fourth inverter IV14.

The multiplexer 111-1-3 is configured to output the output of the flip-flop part 111-1-2 as the first bit addset0<0> of the first designating address addset0<0:4> when the first chip fuse signal SLICE_fuse<0> is enabled to the high level, and output the address setting start pulse addset_start as the first bit addset0<0> of the first designating address addset0<0:4> when the first chip fuse signal SLICE_fuse<0> is disabled to the low level.

The multiplexer 111-1-3 may include a sixth inverter IV16, and third and fourth pass gates PG13 and PG14. The sixth inverter IV16 receives the first chip fuse signal SLICE_fuse<0>. The third pass gate PG13 receives the first chip fuse signal SLICE_fuse<0> through the first control terminal, the output signal of the sixth inverter IV16 through the second control terminal, and the output signal of the flip-flop 111-1-2 through the input terminal. The fourth pass gate PG14 receives the output signal of the sixth inverter IV16 through the first control terminal, the first chip fuse signal SLICE_fuse<0> through the second control terminal, and the address setting start pulse addset_start through the input terminal. The first bit addset0<0> of the first designating address addset0<0:4> is outputted from a node to which the third pass gate PG13 and the fourth pass gate PG14 are commonly coupled.

Figure 5:
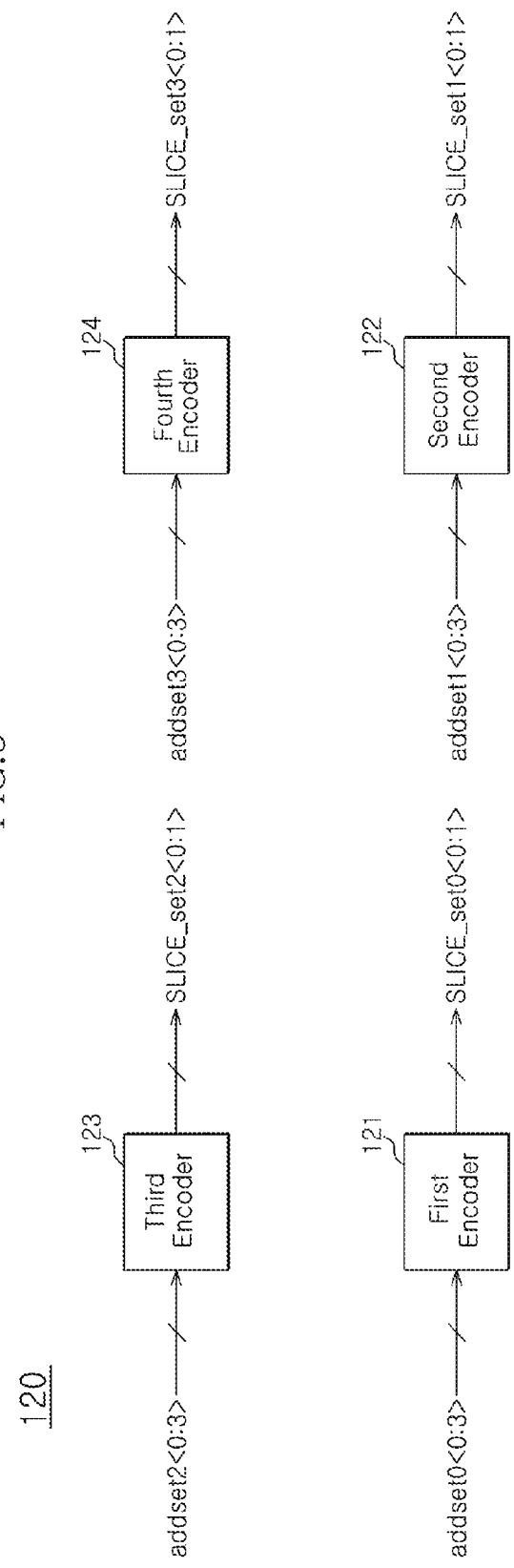
FIG. 5 is a diagram illustrating a configuration of the encoding unit shown in FIG. 2.

Referring to FIG. 5, the encoding unit 120 shown in FIG. 2 may include first to fourth encoders 121-124. The first encoder 121 is configured to encode the first designating address addset0<0:3> and generate the first individual chip designating code SLICE_set0<0:1>. The second encoder 122 is configured to encode the second designating address addset1<0:3> and generate the second individual chip designating code SLICE_set1<0:1>. The third encoder 123 is configured to encode the third designating address addset2<0:3> and generate the third individual chip designating code SLICE_set2<0:1>. The fourth encoder 124 is configured to encode the fourth designating address addset3<0:3> and generate the fourth individual chip designating code SLICE_set3<0:1>.

Figure 6:
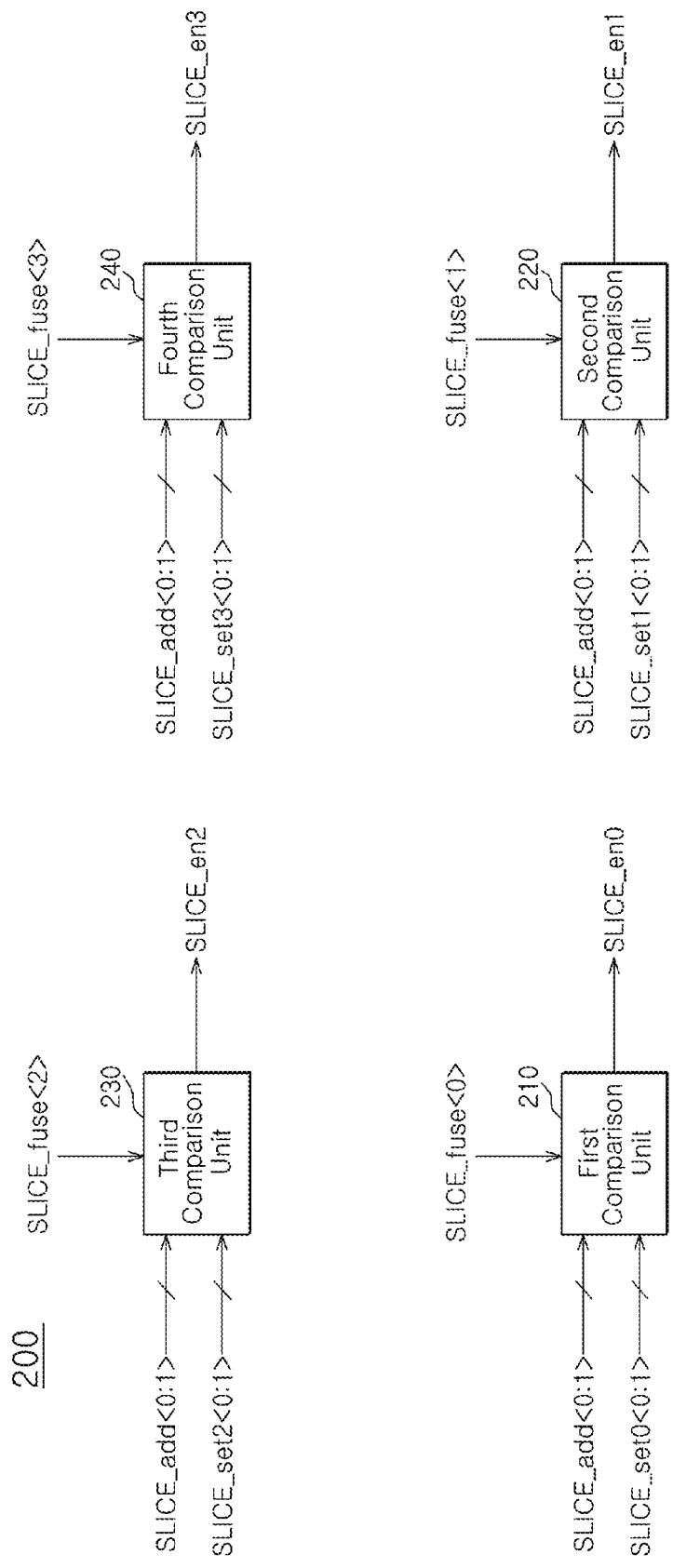
FIG. 6 is a diagram illustrating a configuration of the individual chip activation block shown in FIG. 1.

Referring to FIG. 6, the individual chip activation block 200 shown in FIG. 1 may include first to fourth comparison units 210-240.

The first comparison unit 210 is configured to enable the first individual chip activation signal SLICE_en0 if the chip selection address SLICE_add<0:1> and the first individual chip designating code SLICE_set0<0:1> are the same when the first chip fuse signal SLICE_fuse<0> is enabled. The first comparison unit 210 is configured to disable the first individual chip activation signal SLICE_en0 regardless of the chip selection address SLICE_add<0:1> and the first individual chip designating code SLICE_set0<0:1> when the first chip fuse signal SLICE_fuse<0> is disabled.

The second comparison unit 220 is configured to enable the second individual chip activation signal SLICE_en1 if the chip selection address SLICE_add<0:1> and the second individual chip designating code SLICE_set1<0:1> are the same when the second chip fuse signal SLICE_fuse<1> is enabled. The second comparison unit 220 is configured to disable the second individual chip activation signal SLICE_en1 regardless of the chip selection address SLICE_add<0:1> and the second individual chip designating code SLICE_set1<0:1> when the second chip fuse signal SLICE_fuse<1> is disabled.

The third comparison unit 230 is configured to enable the third individual chip activation signal SLICE_en2 if the chip selection address SLICE_add<0:1> and the third individual chip designating code SLICE_set2<0:1> are the same when the third chip fuse signal SLICE_fuse<2> is enabled. The third comparison unit 230 is configured to disable the third individual chip activation signal SLICE_en2 regardless of the chip selection address SLICE_add<0:1> and the third individual chip designating code SLICE_set2<0:1> when the third chip fuse signal SLICE_fuse<2> is disabled.

The fourth comparison unit 240 is configured to enable the fourth individual chip activation signal SLICE_en3 if the chip selection address SLICE_add<0:1> and the fourth individual chip designating code SLICE_set3<0:1> are the same when the fourth chip fuse signal SLICE_fuse<3> is enabled. The fourth comparison unit 240 is configured to disable the fourth individual chip activation signal SLICE_en3 regardless of the chip selection address SLICE_add<0:1> and the fourth individual chip designating code SLICE_set3<0:1> when the fourth chip fuse signal SLICE_fuse<3> is disabled.

The semiconductor apparatus in accordance with the embodiment of the present invention, configured as described above, operates as described below.

It is assumed that the semiconductor apparatus in accordance with the embodiment of the present invention is a semiconductor apparatus in which four chips (first to fourth individual chips) are stacked. The first individual chip is activated if the first individual chip activation signal SLICE_en0 is enabled, the second individual chip is activated if the second individual chip activation signal SLICE_en1 is enabled, the third individual chip is activated if the third individual chip activation signal SLICE_en2 is enabled, and the fourth individual chip is activated if the fourth individual chip activation signal SLICE_en3 is enabled.

If any of the first to fourth individual chips does not fail, all the first to fourth chip fuse signals SLICE_fuse<0:3> are enabled.

Referring to FIG. 3, where all the first to fourth chip fuse signals SLICE_fuse<0:3> are enabled, when the address setting start pulse addset_start enabled to a high level is inputted and four cycles of the clock CLK elapse after the address setting start pulse addset_start is inputted, the first designating address set generation section 111 outputs the address setting start pulse addset_start as the fourth bit addset0<3> of the first designating address addset0<0:3> through the first output selection flip-flop 111-1, the first flip-flop 111-2, the second flip-flop 111-3 and the third flip-flop 111-4. Accordingly, the first designating address addset0<0:3> has the code value of '0001'. At the same time, i.e., when four cycles of the clock CLK elapse after the address setting start pulse addset_start is inputted, the second designating address set generation section 112 outputs the address setting start pulse addset_start having passed through the first output selection flip-flop 111-1, the second output selection flip-flop 112-1, the fourth flip-flop 112-2 and the fifth flip-flop 112-3 as the third bit addset1<2> of the second designating address addset1<0:3>. Accordingly, the second designating address addset1<0:3> has the code value of '0010'. At the same time, i.e., when four cycles of the clock CLK elapse after the address setting start pulse addset_start is inputted, the third designating address set generation section 113 outputs the address setting start pulse addset_start having passed through the first output selection flip-flop 111-1, the second output selection flip-flop 112-1, the third output selection flip-flop 113-1 and the seventh flip-flop 113-2 as the second bit addset2<1> of the third designating address addset2<0:3>. Accordingly, the third designating address addset2<0:3> has the code value of '0100'. At the same time, i.e., when four cycles of the clock CLK elapse after the address setting start pulse addset_start is inputted, the fourth designating address set generation section 114 outputs the address setting start pulse addset_start having passed through the first through third output selection flip-flop 111-1, 112-1 and 113-1 and the fourth output selection flip-flop 114-1 as the first bit addset3<0> of the fourth designating address addset3<0:3>. Accordingly, the fourth designating address addset3<0:3> has the code value of '1000'.

As a result, when all the first to fourth chip fuse signals SLICE_fuse<0:3> are enabled, the first to fourth designating addresses addset0<0:3>, addset1<0:3>, addset2<0:3> and addset3<0:3> respectively have the code values of '0001', '0010', '0100', and '1000'.

Such first to fourth designating addresses addset0<0:3>, addset1<0:3>, addset2<0:3> and addset3<0:3> are encoded through the first to fourth encoders 121-124. The first to fourth encoders 121-124 output the encoding results as the first to fourth individual chip designating codes SLICE_set0<0:1>, SLICE_set1<0:1>, SLICE_set2<0:1> and SLICE_set3<0:1> which have the code values of '00', '01', '10' and '11', respectively.

When all the first to fourth chip fuse signals SLICE_fuse<0:3> are enabled, the first to fourth comparison units 210-240 are activated, thereafter compare the first to fourth individual chip designating codes SLICE_set0<0:1>, SLICE_set1<0:1>, SLICE_set2<0:1> and SLICE_set3<0:1> with the chip selection address SLICE_add<0:1>, and generate the first to fourth individual chip activation signals SLICE_en0-SLICE_en3.

If the chip selection address SLICE_add<0:1> are the same as the first individual chip designating code SLICE_set0<0:1>, that is, the chip selection address SLICE_add<0:1> has the code value of '00', the first individual chip activation signal SLICE_en0 is enabled.

If the chip selection address SLICE_add<0:1> are the same as the second individual chip designating code SLICE_set1<0:1>, that is, the chip selection address SLICE_add<0:1> has the code value of '01', the second individual chip activation signal SLICE_en1 is enabled.

If the chip selection address SLICE_add<0:1> are the same as the third individual chip designating code SLICE_set2<0:1>, that is, the chip selection address SLICE_add<0:1> has the code value of '10', the third individual chip activation signal SLICE_en2 is enabled.

If the chip selection address SLICE_add<0:1> are the same as the fourth individual chip designating code SLICE_set3<0:1>, that is, the chip selection address SLICE_add<0:1> has the code value of '11', the fourth individual chip activation signal SLICE_en3 is enabled.

As a consequence, the semiconductor apparatus in accordance with the embodiment of the present invention may selectively enable one of the first to fourth individual chip activation signals SLICE_en0-SLICE_en3 according to the code value of the chip selection address SLICE_add<0:1>.

Next, it is assumed that one of the first to fourth individual chips has failed. For example, it is assumed that the second individual chip among the first to fourth individual chips has failed. Accordingly, only the second chip fuse signal SLICE_fuse<1> is disabled among the first to fourth chip fuse signals SLICE_fuse<0:3>.

Referring to FIG. 3, after four cycles of the clock CLK, the first designating address set generation section 111 outputs the address setting start pulse addset_start as the fourth bit addset0<3> of the first designating address addset0<0:3>, and outputs the remaining bits of the designating address addset0<0:2> of the first designating address addset0<0:3> except the fourth bit addset0<3> to a low level.

Accordingly, the first designating address set generation section 111, which receives the enabled first chip fuse signal SLICE_fuse<0>, generates the first designating address addset0<0:3> having the code value of '0001'.

At the same time, i.e., after the four cycles of the clock CLK, the second designating address set generation section 112, which receives the disabled second chip fuse signal SLICE_fuse<1>, outputs the fourth bit addset1<3> of the second designating address addset1<0:3> to a high level. This is because the second output selection flip-flop 112-1 transfers the output of the first output selection flip-flop 111-1 to the fourth flip-flop 112-2 even before one cycle of the clock CLK elapses. Thus, during the four cycles of the clock CLK, the address setting start pulse addset_start passes through the first output selection flip-flop 111-1, the fourth flip-flop 112-2, the fifth flip-flop 112-3 and the sixth flip-flop 112-4, and set the fourth bit addset1<3> of the second designating address addset1<0:3> to a high level.

Accordingly, the second designating address set generation section 112, which receives the disabled second chip fuse signal SLICE_fuse<1>, generates the second designating address addset1<0:3> having the code value of '0001' after the four cycles of the clock CLK.

At the same time, i.e., after the four cycles of the clock CLK, the third designating address set generation section 113, which receives the enabled third chip fuse signal SLICE_fuse<2>, generates the third designating address addset2<0:3> having the code value of '0010'. This is because, during the four cycles of the clock CLK, the address setting start pulse addset_start passes through the first output selection flip-flop 111-1, the third output selection flip-flop 113-1, the seventh flip-flop 113-2 and the eighth flip-flop 113-3, and outputted as the third bit addset2<2> of the third designating address addset2<0:3>.

At the same time, i.e., after the four cycles of the clock CLK, the fourth designating address set generation section 114, which receives the enabled fourth chip fuse signal SLICE_fuse<3>, generates the fourth designating address addset3<0:3> having the code value of '0100'. This is because, during the four cycles of the clock CLK, the address setting start pulse addset_start passes through the first output selection flip-flop 111-1, the third output selection flip-flop 113-1, the fourth selection flip-flop 114-1 and the tenth flip-flop 114-2, and is outputted as the second bit addset3<1> of the fourth designating address addset3<0:3>.

As a result, if only the second chip fuse signal SLICE_fuse<1> is disabled among the first to fourth chip fuse signals SLICE_fuse<0:3>, the first to fourth designating addresses addset0<0:3>, addset1<0:3>, addset2<0:3> and addset3<0:3> have the code values of '0001', '0001', '0010' and '0100', respectively.

The first to fourth encoders 121-124 encode the first to fourth designating addresses addset0<0:3>, addset1<0:3>, addset2<0:3> and addset3<0:3>, and generate the first to fourth individual chip designating codes SLICE_set0<0:1>, SLICE_set1<0:1>, SLICE_set2<0:1>, SLICE_set3<0:3> which have the code values of '00', '00', '01' and '10', respectively.

Since only the second chip fuse signal SLICE_fuse<1> is disabled among the first through fourth chip fuse signals SLICE_fuse<0:3>, the first comparison unit 210, the third comparison unit 230 and the fourth comparison unit 240 are enabled, and the second comparison unit 220 is disabled.

Accordingly, if the chip selection address SLICE_add<0:1> is the same as the first individual chip designating code SLICE_set0<0:1>, that is, the chip selection address SLICE_add<0:1> has the code value of '00', the first individual chip activation signal SLICE_en0 is enabled.

As the second comparison unit 220 is disabled, the second comparison unit 220 disables the second individual chip activation signal SLICE_en1 regardless of the chip selection address SLICE_add<0:1> and the second individual chip designating code SLICE_set1<0:1>.

If the chip selection address SLICE_add<0:1> is the same as the third individual chip designating code SLICE_set2<0:1>, that is, the chip selection address SLICE_add<0:1> has the code value of '01', the third individual chip activation signal SLICE_en2 is enabled.

If the chip selection address SLICE_add<0:1> is the same as the fourth individual chip designating code SLICE_set3<0:1>, that is, the chip selection address SLICE_add<0:1> has the code value of '10', the fourth individual chip activation signal SLICE_en3 is enabled.

As other example, it is assumed that fails occur in the second and third individual chips among the first to fourth individual chips. Accordingly, only the second and third chip fuse signals SLICE_fuse<1:2> are disabled among the first to fourth chip fuse signals SLICE_fuse<0:3>.

When four cycles of the clock CLK elapse after the address setting start pulse addset_start is inputted, the address setting start pulse addset_start passes through the first output selection flip-flop 111-1 and the first to third flip-flops 111-2-111-4, and is outputted as the fourth bit addset0<3> of the first designating address addset0<0:3>. Accordingly, the first designating address addset0<0:3> has the code value of '0001'.

At the same time, i.e., when four cycles of the clock CLK elapse after the address setting start pulse addset_start is inputted, the address setting start pulse addset_start passes through the first output selection flip-flop 111-1 and the fourth to sixth flip-flops 112-2-112-4, and is outputted as the fourth bit addset1<3> of the second designating address addset1<0:3>. Accordingly, the second designating address addset1<0:3> has the code value of '0001'.

At the same time, i.e., when four cycles of the clock CLK elapse after the address setting start pulse addset_start is inputted, the address setting start pulse addset_start passes through the first output selection flip-flop 111-1 and the seventh to ninth flip-flops 113-2-113-4, and is outputted as the fourth bit addset2<3> of the third designating address addset2<0:3>. Accordingly, the third designating address addset2<0:3> has the code value of '0001'.

At the same time, i.e., when four cycles of the clock CLK elapse after the address setting start pulse addset_start is inputted, the address setting start pulse addset_start passes through the first output selection flip-flop 111-1, the fourth output selection flip-flop 114-1, and the tenth and eleventh flip-flops 114-2 and 114-3, and is outputted as the third bit addset3<2> of the fourth designating address addset3<0:3>. Accordingly, the fourth designating address addset3<0:3> has the code value of '0010'.

By encoding these first to fourth designating addresses addset0<0:3>, addset1<0:3>, addset2<0:3> and addset3<0:3>, the first to fourth individual chip designating codes SLICE_set0<0:1>, SLICE_set1<0:1>, SLICE_set2<0:1> and SLICE_set3<0:1>, which have the code values of '00', '00', '00' and '01', respectively, are generated.

If the chip selection address SLICE_add<0:1> is the same as the first individual chip designating code SLICE_set0<0:1>, that is, the chip selection address SLICE_add<0:1> has the code value of '00', the first individual chip activation signal SLICE_en0 is enabled.

Since the second and third chip fuse signals SLICE_fuse<1:2> are disabled, the second and third individual chip activation signals SLICE_en1 and SLICE_en2 are disabled regardless of the chip selection address SLICE_add<0:1> and the second and third individual chip designating codes SLICE_set1<0:1> and SLICE_set2<0:1>.

If the chip selection address SLICE_add<0:1> is the same as the fourth individual chip designating code SLICE_set3<0:1>, that is, the chip selection address SLICE_add<0:1> has the code value of '01', the fourth individual chip activation signal SLICE_en3 is enabled.

As described above, the semiconductor apparatus in accordance with the embodiment of the present invention can generate, in response to chip fuse signals, a plurality of individual chip designating codes which have different code values or at least one of which has the same code value as a previous individual chip designating code. The individual chip designating code which has the same code value as the previous individual chip designating code is a designating code of an individual chip which fails, thus the remaining individual chip designating codes except one of the failing individual chip can be generated in sequentially increasing or decreasing order. For example, if a fail does not occur in the first to fourth individual chips, the first to fourth individual chip designating codes assigned to the first to fourth individual chips have the code values of '00', '01', '10' and '11', respectively. However, if the second individual chip fails among the first to fourth individual chips, the first to fourth individual chip designating codes have the code values of '00', '00', '01' and '10', respectively. That is to say, the designating code of the second individual chip which fails has with the same code value as the first individual chip designating code, the second individual chip designating codes are not used in enabling a corresponding individual chip activation signal, and the third individual chip designating code has a code value next to that of the first individual chip designating code. Thus, when a command to store data to the second individual chip is received from outside of the semiconductor apparatus, the data is stored not in the second individual chip but in the third individual chip.

While a certain embodiment has been described above with reference to illustrative examples for particular applications, it will be understood to those skilled in the art that the embodiment described is by way of example only. Those skilled in the art with access to the teachings provided in this disclosure will recognize additional modifications, applications, and/or embodiments and additional fields in which the present disclosure would be of significant utility. Accordingly, the semiconductor apparatus described herein should not be limited based on the described embodiment. Rather, the semiconductor apparatus described herein should only be limited in light of the claims that follow when taken in conjunction with the above description and accompanying drawings.

What is claimed is:

1. A semiconductor apparatus comprising:
    an individual chip designating code setting block configured to generate a plurality of individual chip designating codes which have different code values or at least two of which have the same code value, in response to a plurality of chip fuse signals,
    wherein the individual chip designating code setting block is configured to generate the plurality of individual chip designating codes having different code values, when all the plurality of chip fuse signals are enabled, and
    wherein the individual chip designating code setting block is configured to determine the number of individual chip designating codes having the same code value in response to a disabled chip fuse signal among the plurality of chip fuse signals; and an individual chip activation block configured to compare the plurality of individual chip designating codes with a chip selection address in response to the plurality of chip fuse signals, and enable one of a plurality of individual chip activation signals based on a result of the comparison.

2. The semiconductor apparatus according to claim 1, wherein the plurality of individual chip designating codes include a first individual chip designating code, a second individual chip designating code, a third individual chip designating code, and a fourth individual chip designating code, and wherein the individual chip designating code setting block is configured to set respective code values of the first to fourth individual chip designating codes sequentially increase or decrease when all the plurality of chip fuse signals are enabled.

3. The semiconductor apparatus according to claim 2, wherein the plurality of chip fuse signals include a first chip fuse signal, a second chip fuse signal, a third chip fuse signal, and a fourth chip fuse signal, wherein the individual chip designating code setting block initializes the first individual chip designating code when the first chip fuse signal is disabled, wherein the individual chip designating code setting block generates the second individual chip designating code having the same code value as the first individual chip designating code when the second chip fuse signal is disabled, wherein the individual chip designating code setting block generates the third individual chip designating code having the same code value as the second individual chip designating code when the third chip fuse signal is disabled, and wherein the individual chip designating code setting block generates the fourth individual chip designating code which has the same code value as the third individual chip designating code when the fourth chip fuse signal is disabled.

4. The semiconductor apparatus according to claim 3, wherein the individual chip designating code setting block comprises:

an individual chip designating address setting unit configured to generate first to fourth designating addresses in response to the first to fourth chip fuse signals; and an encoding unit configured to encode the first to fourth designating addresses and generate the first to fourth individual chip designating codes.

5. The semiconductor apparatus according to claim 4, wherein the individual chip designating address setting unit generates the first to fourth designating addresses having different values when all the first to fourth chip fuse signals are enabled, wherein the individual chip designating address setting unit initializes the first designating address when the first chip fuse signal is disabled, wherein the individual chip designating address setting unit generates the second designating address having the same value as the first designating address when the second chip fuse signal is disabled, wherein the individual chip designating address setting unit generates the third designating address having the same value as the second designating address when the third chip fuse signal is disabled, and wherein the individual chip designating address setting unit generates the fourth designating address having the same value as the third designating address when the fourth chip fuse signal is disabled.

6. The semiconductor apparatus according to claim 5, wherein the individual chip designating address setting unit comprises:

a first designating address set generation section configured to generate the first designating address in response to the first chip fuse signal;

a second designating address set generation section configured to generate the second designating address in response to the second chip fuse signal;

a third designating address set generation section configured to generate the third designating address in response to the third chip fuse signal; and a fourth designating address set generation section configured to generate the fourth designating address in response to the fourth chip fuse signal.

7. The semiconductor apparatus according to claim 6, wherein the first designating address set generation section comprises:

a first output selection flip-flop configured to output an address setting start pulse as a first designating address of the first designating address without delay or after one cycle of a clock in response to the address setting start pulse and the first chip fuse signal;

a first flip-flop configured to receive an output of the first output selection flip-flop and output the received output as a second designating address of the first designating address after one cycle of the clock;

a second flip-flop configured to receive an output of the first flip-flop and output the received output as a third designating address of the first designating address after one cycle of the clock; and a third flip-flop configured to receive an output of the second flip-flop and output the received output as a fourth designating address of the first designating address after one cycle of the clock.

8. The semiconductor apparatus according to claim 7, wherein the second designating address set generation section comprises:

a second output selection flip-flop configured to output an output of the first output selection flip-flop as a first designating address of the second designating address without delay or after one cycle of the clock in response to the second chip fuse signal;

a fourth flip-flop configured to receive an output of the second output selection flip-flop and output the received output as a second designating address of the second designating address after one cycle of the clock;

a fifth flip-flop configured to receive an output of the fourth flip-flop and output the received output as a third designating address of the second designating address after one cycle of the clock; and a sixth flip-flop configured to receive an output of the fifth flip-flop and output the received output as a fourth designating address of the second designating address after one cycle of the clock.

9. The semiconductor apparatus according to claim 8, wherein the third designating address set generation section comprises:

a third output selection flip-flop configured to output an output of the second output selection flip-flop as a first designating address of the third designating address without delay or after one cycle of the clock in response to the third chip fuse signal;

a seventh flip-flop configured to receive an output of the third output selection flip-flop and output the received output as a second designating address of the third designating address after one cycle of the clock;
an eighth flip-flop configured to receive an output of the seventh flip-flop and output the received output as a third designating address of the third designating address after one cycle of the clock; and
a ninth flip-flop configured to receive an output of the eighth flip-flop and output the received output as a fourth designating address of the third designating address after one cycle of the clock.

10. The semiconductor apparatus according to claim 9, wherein the fourth designating address set generation section comprises:
a fourth output selection flip-flop configured to output an output of the third output selection flip-flop as a first designating address of the fourth designating address without delay or after one cycle of the clock in response to the fourth chip fuse signal;
a tenth flip-flop configured to receive an output of the fourth output selection flip-flop and output the received output as a second designating address of the fourth designating address after one cycle of the clock;
an eleventh flip-flop configured to receive an output of the tenth flip-flop and output the received output as a third designating address of the fourth designating address after one cycle of the clock; and
a twelfth flip-flop configured to receive an output of the eleventh flip-flop and output the received output as a fourth designating address of the fourth designating address after one cycle of the clock.

11. The semiconductor apparatus according to claim 4, wherein the encoding unit comprises:
a first encoder configured to encode the first designating address and generate the first individual chip designating code;
a second encoder configured to encode the second designating address and generate the second individual chip designating code;
a third encoder configured to encode the third designating address and generate the third individual chip designating code; and
a fourth encoder configured to encode the fourth designating address and generate the fourth individual chip designating code.

12. The semiconductor apparatus according to claim 3, wherein the plurality of individual chip activation signals include a first individual chip activation signal, a second individual chip activation signal, a third individual chip activation signal, and a fourth individual chip activation signal, and
wherein the individual chip activation block comprises:
a first comparison unit configured to enable the first individual chip activation signal if the first individual chip designating code and the chip selection address are the same when the first chip fuse signal is enabled;
a second comparison unit configured to enable the second individual chip activation signal if the second individual chip designating code and the chip selection address are the same when the second chip fuse signal is enabled;
a third comparison unit configured to enable the third individual chip activation signal if the third individual chip designating code and the chip selection address are the same when the third chip fuse signal is enabled; and
a fourth comparison unit configured to enable the fourth individual chip activation signal if the fourth individual chip designating code and the chip selection address are the same when the fourth chip fuse signal is enabled.

13. The semiconductor apparatus according to claim 12, wherein the first comparison unit disables the first individual chip activation signal regardless of the first individual chip designating code and the chip selection address when the first enable control signal is disabled,
wherein the second comparison unit disables the second individual chip activation signal regardless of the second individual chip designating code and the chip selection address when the second enable control signal is disabled,
wherein the third comparison unit disables the third individual chip activation signal regardless of the third individual chip designating code and the chip selection address when the third enable control signal is disabled, and
wherein the fourth comparison unit disables the fourth individual chip activation signal regardless of the fourth individual chip designating code and the chip selection address when the fourth enable control signal is disabled.

14. A semiconductor apparatus generating a first individual chip designating code, a second individual chip designating code and a third individual chip designating code, comprising:
an individual chip designating code setting block configured to generate the third individual chip designating code having a code value next to a code value of the first individual chip designating code when the second individual chip designating code is generated to have the same code value as the first individual chip designating code, wherein the first to third individual chip designating codes are compared with a chip selection address to enable one of a first individual chip activation signal, a second individual chip activation signal and a third individual chip activation signal.

15. The semiconductor apparatus according to claim 14, wherein the individual chip designating code setting block is configured to generate the first to third individual chip designating codes having sequentially increasing code values when a chip fuse signal is enabled, and
wherein the individual chip designating code setting block is configured to generate the first and second individual chip designating codes having the same code value, and the third individual chip designating code having a code value next to a code value of the first individual chip designating code when the chip fuse signal is disabled.

16. The semiconductor apparatus according to claim 15, wherein the individual chip designating code setting block comprises:
an individual chip designating address setting unit configured to generate first to third designating addresses in response to the chip fuse signal when an address setting start pulse is inputted and a predetermined number of cycles of a clock elapse; and
an encoding unit configured to generate the first to third individual chip designating codes by encoding the first to third designating addresses.

17. The semiconductor apparatus according to claim 16, wherein the individual chip designating address setting unit comprises:
a first designating address set generation section having a first set of flip-flops coupled in series, a first flip-flop of the first set of flip-flops receiving the address setting start pulse;

a second designating address set generation section having an output selection flip-flop and a second set of flip-flops coupled in series, a first flip-flop of the second set of flip-flops receiving an output of the output selection flip-flop; and a third designating address set generation section having a third set of flip-flops coupled in series, a first flip-flop of the third set of flip-flops receiving the output of the output selection flip-flop, wherein the output selection flip-flop outputs an output of the first flip-flop of the first set of flip-flops after one cycle of the clock when the chip fuse signal is enabled, and wherein the output selection flip-flop outputs the output of the first flip-flop of the first set of flip-flops regardless of the clock when the chip fuse signal is disabled.

18. The semiconductor apparatus according to claim 17, wherein the flip-flops of the first designating address set generation section output the first designating address, wherein the flip-flops and the output selection flip-flop of the second designating address set generation section output the second designating address, and wherein the flip-flops of the third designating address set generation section output the third designating address.

19. The semiconductor apparatus according to claim 14, further comprising:

a first comparison unit configured to enable the first individual chip activation signal when the first individual chip designating code and the chip selection address are the same;

a second comparison unit configured to enable the second individual chip activation signal when the second individual chip designating code and the chip selection address are the same if the chip fuse signal is enabled, and disable the second individual chip activation signal regardless of the second individual chip designating code and the chip selection address if the chip fuse signal is disabled; and a third comparison unit configured to enable the third individual chip activation signal when the third individual chip designating code and the chip selection address are the same.

* * * * *